United States Patent
Okano et al.

(10) Patent No.: US 7,418,687 B2
(45) Date of Patent: Aug. 26, 2008

(54) INFORMATION PROCESSING APPARATUS AND INFORMATION DISPLAY METHOD

(75) Inventors: Motochika Okano, Oumi (JP); Kazushi Ikeda, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 11/168,330

(22) Filed: Jun. 29, 2005

(65) Prior Publication Data

US 2006/0002215 A1    Jan. 5, 2006

(30) Foreign Application Priority Data

Jun. 30, 2004   (JP)   ............... 2004-192935

(51) Int. Cl.
*G06F 17/50* (2006.01)
*G06F 9/455* (2006.01)
*H03K 17/693* (2006.01)

(52) U.S. Cl. ......................... 716/11; 716/15

(58) Field of Classification Search .............. 716/11, 716/15
See application file for complete search history.

(56) References Cited

U.S. PATENT DOCUMENTS

| | | | | |
|---|---|---|---|---|
| 5,546,321 A | * | 8/1996 | Chang et al. | 716/1 |
| 6,557,154 B1 | * | 4/2003 | Harada et al. | 716/11 |
| 2003/0014725 A1 | * | 1/2003 | Sato et al. | 716/10 |
| 2003/0084415 A1 | * | 5/2003 | Sasaki et al. | 716/4 |

FOREIGN PATENT DOCUMENTS

JP    2003-186942    7/2003

* cited by examiner

*Primary Examiner*—Jack Chiang
*Assistant Examiner*—Suresh Memula
(74) *Attorney, Agent, or Firm*—Pillsbury Winthrop Shaw Pittman LLP (57) ABSTRACT

An information processing apparatus includes: an input unit; a storing unit configured to store wiring layout information and layer configuration information of a multilayer printed circuit board; a layout displaying unit configured to display a wiring layout drawing based on the wiring layout information; a clipping position specifying unit configured to specify a clipping position on the displayed wiring layout drawing in response to user's operation of the input unit; and a cross section displaying unit configured to display a cross section indicating a cross-sectional structure of the wiring layout of the multilayer printed circuit board along the specified clipping position on the display based on the wiring layout information and the layer configuration information.

21 Claims, 11 Drawing Sheets

INFORMATION PROCESSING APPARATUS AND INFORMATION DISPLAY METHOD

The present disclosure relates to the subject matter contained in Japanese Patent Application No. 2004-192935 filed Jun. 30, 2004, which is incorporated herein by reference in its entirety.

BACKGROUND OF THE INVENTION

1. Field of the Invention

The present invention relates to an information processing apparatus for displaying information concerning a multilayer printed circuit board and an information display method used with the apparatus.

2. Background Art

In recent years, CAD (computer-aided design) has been used for design of a printed circuit board. The CAD enables the user to easily design the wiring layout of a printed circuit board, etc. The design data generated using the CAD contains circuit diagram data and layout drawing data. The layout drawing data is information indicating the wiring layout of a printed circuit board. Using the layout drawing data, a wiring layout drawing indicating the wiring layout of the designed printed circuit board can be displayed on a display of a computer. The wiring layout drawing is a drawing of viewing the signal layer of the printed circuit board from above.

A design supporting system having a function of calculating the characteristic impedance of the wiring of a printed circuit board is also known. (For example, refer to JP-A-2003-186942) The characteristic impedance of the wiring is calculated to check whether or not the designed wiring is good.

SUMMARY OF THE INVENTION

By the way, recently, a multilayer printed circuit board has been often used to provide high-density packaging. In the multilayer printed circuit board, a plurality of signal lines are distributed to a plurality of signal layers for placement. Therefore, it is practically difficult for the user to check how the signal lines are distributed to the plurality of signal layers only from the wiring layout drawing described above.

In JP-A-2003-186942, an interface for allowing the user to specify the wiring whose impedance is to be calculated is not considered.

Therefore, a new function to make efficient evaluation/check work of the design data of a multilayer printed circuit board needs to be provided.

It is therefore an object of the invention to provide an information processing apparatus and an information display method for making it possible to display the cross-sectional shape corresponding to any desired position of a multilayer printed circuit board and display the impedance value of any desired signal line specified by the user.

To achieve the object, the invention provides an information processing apparatus including: an input unit; a storing unit configured to store wiring layout information indicating a wiring layout of a multilayer printed circuit board and layer configuration information indicating the layer configuration of the multilayer printed circuit board; a layout displaying unit configured to display a wiring layout drawing indicating the wiring layout of the multilayer printed circuit board on a display based on the wiring layout information; a position specifying unit configured to specify a position on the displayed wiring layout drawing in response to user's operation of the input unit; and a cross section displaying unit configured to display a cross section indicating a cross-sectional structure of the wiring layout of the multilayer printed circuit board along the specified position on the display based on the wiring layout information and the layer configuration information.

The invention provides an information display method including: displaying a wiring layout drawing indicating a wiring layout of a multilayer printed circuit board on a display based on wiring layout information indicating the wiring layout of a multilayer printed circuit board; specifying a position on the displayed wiring layout drawing in response to user's operation; and displaying a cross section indicating a cross-sectional structure of the wiring layout of the multilayer printed circuit board along the specified position on the display based on layer configuration information indicating the layer configuration of the multilayer printed circuit board and the wiring layout information.

The invention provides a program product for enabling a computer to execute processing of displaying information including: software instructions for enabling the computer to perform predetermined operations; and a computer readable medium bearing the software instructions. The predetermined operations include: displaying a wiring layout drawing indicating a wiring layout of a multilayer printed circuit board on a display based on wiring layout information indicating the wiring layout of the multilayer printed circuit board, specifying a position on the displayed wiring layout drawing in response to user's operation, and displaying a cross section indicating a cross-sectional structure of the wiring layout of the multilayer printed circuit board along the specified position on the display based on layer configuration information indicating a layer configuration of the multilayer printed circuit board and the wiring layout information.

BRIEF DESCRIPTION OF THE DRAWINGS

The present invention may be more readily described with reference to the accompanying drawings.

DETAILED DESCRIPTION OF THE PREFERRED EMBODIMENTS

Referring now to the accompanying drawings, there is shown a preferred embodiment of the invention.

Figure 1:
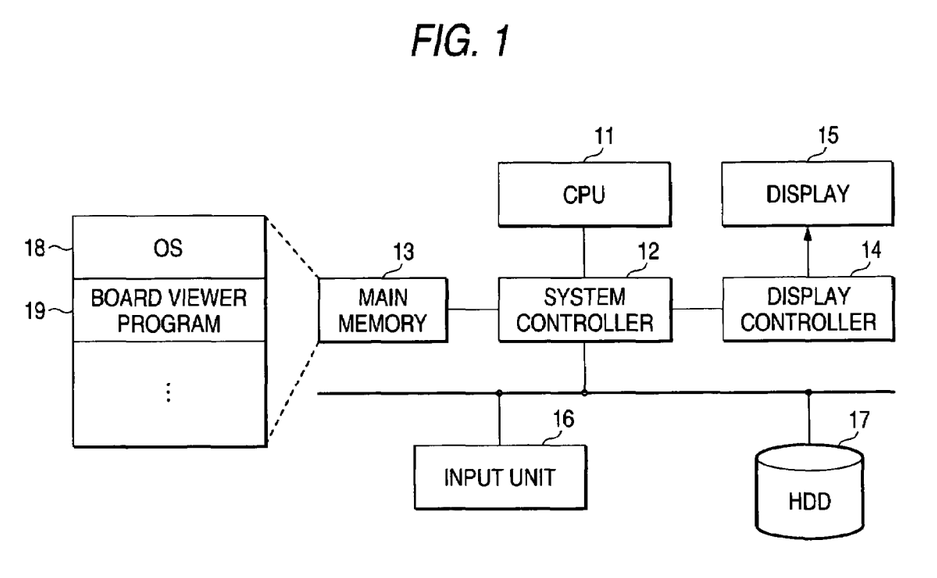
FIG. 1 is a block diagram to show the system configuration of an information processing apparatus according to one embodiment of the invention.

FIG. 1 shows the system configuration of an information processing apparatus according to one embodiment of the invention. This information processing apparatus functions as a display system for displaying information concerning a multilayer printed circuit board designed using CAD. The display system is used to efficiently check the design data of a multilayer printed circuit board. The information processing apparatus is implemented as a computer such as a workstation, a personal computer, or a server computer, for example.

The information processing apparatus includes a CPU 11, a system controller 12, main memory 13, a display controller 14, a display 15, an input unit 16, and disk storage 17 such as an HDD (hard disk drive), as shown in FIG. 1.

The CPU 11 is a processor for controlling the operation of the information processing apparatus. The CPU 11 executes an operating system (OS) 18 and a board viewer program 19 loaded into the main memory 13 from the HDD 17. The board viewer program 19 is a viewer program for displaying a wiring layout drawing of a multilayer printed circuit board designed using CAD and a cross section indicating the cross-sectional structure of the wiring layout of the multilayer printed circuit board (board cross section) on the display 15. The board viewer program 19 also has a function of calculating the impedance value of any desired signal line specified on the board cross section and displaying the impedance value on the display 15.

The system controller 12 includes a memory controller for controlling the main memory 13. The system controller 12 also has a function of executing communications with the display controller 14. The display controller 14 controls the display 15 functioning as a display monitor of the information processing apparatus. The input unit 16 is a unit for the user to enter various pieces of information and is made up of a keyboard, a pointing device, etc. The design information of a multilayer printed circuit board generated using CAD is stored on the HDD 17.

Figure 2:
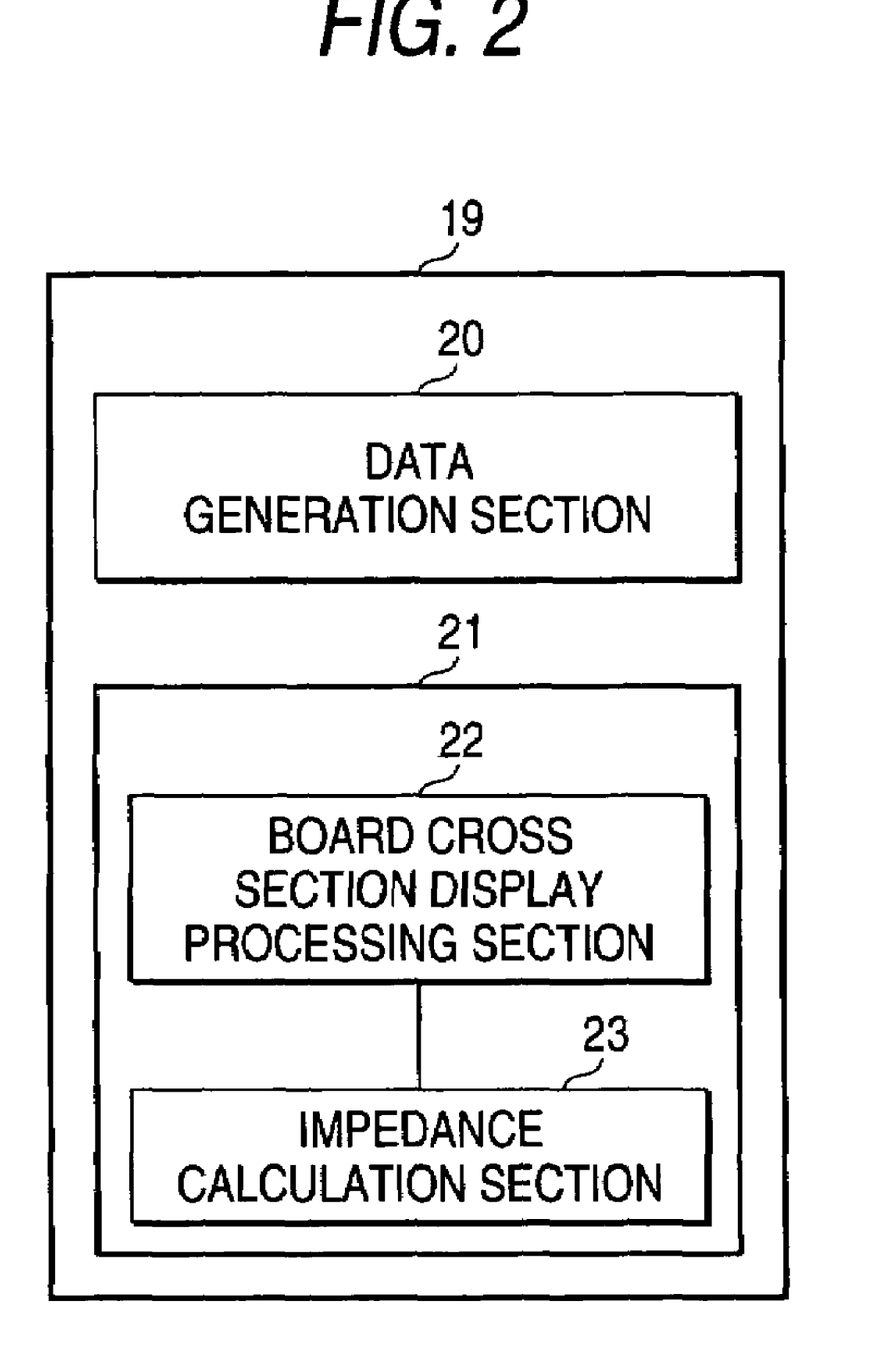
FIG. 2 is a drawing to show the functional configuration of a board viewer program used with the information processing apparatus in FIG. 1.

Next, the functional configuration of the board viewer program 19 will be discussed with reference to FIG. 2.

The board viewer program 19 includes a data generation section 20 and a board display processing section 21 as functional modules. The data generation section 20 is a module for generating board Viewer data with layer configuration. The board Viewer data with layer configuration is made up of the board Viewer data and layer configuration data.

The board Viewer data is wiring layout information indicating the wiring layout of a multilayer printed circuit board designed using CAD. The board Viewer data is one piece of design information of the multilayer printed circuit board generated using CAD. The board Viewer data contains the wiring layout information corresponding to each of a plurality of layers of the multilayer printed circuit board, for example. The layer configuration data is information indicating the layer configuration corresponding to the multilayer printed circuit board designed using CAD (for example, the number of layers making up the multilayer printed circuit board, the thickness of each layer, the material of each layer, the relative dielectric constant of an insulating layer, etc.,).

The board display processing section 21 is a module for displaying the wiring layout drawing indicating the wiring layout of the multilayer printed circuit board on the display 15 based on the board Viewer data. The board display processing section 21 further is provided with a board cross section display processing section 22 and an impedance calculation section 23 as plug-in modules.

The board cross section display processing section 22 is a module for displaying on the display 15 a board cross section indicating the cross-sectional structure of the wiring layout of the multilayer printed circuit board along any desired position on the wiring layout drawing. The board cross section is generated based on the board Viewer data and the layer configuration data. The board cross section makes it possible to present the placement state of the signal lines on each of the signal layers to the user at the same time.

The impedance calculation section 23 is a module for calculating the impedance value of any desired signal line displayed on the board cross section (the characteristic impedance if the signal line is a single line or the differential impedance if the signal line is a differential line pair) and displaying the calculated impedance value on the display 15.

Figure 3:
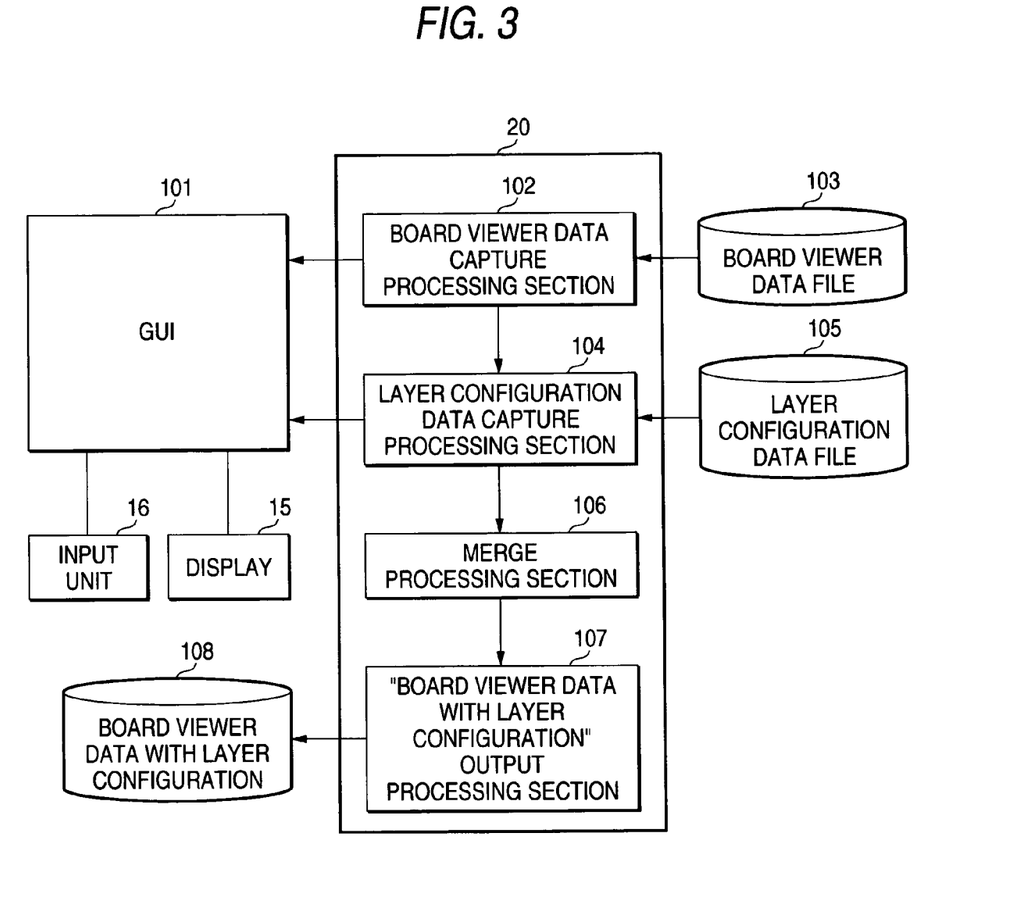
FIG. 3 is a block -diagram to show the configuration of a data generation section included in the board viewer program in FIG. 2.

FIG. 3 shows the specific system configuration of the data generation section 20. The data generation section 20 includes a board viewer data capture processing section 102, a layer configuration data capture processing section 104, a merge processing section 106, and a "board viewer data with layer configuration" output section 107.

The board viewer data capture processing section 102 acquires one of a plurality of pieces of board viewer data previously stored as files in a board viewer data file storage section 103 from the board viewer data file storage section 103. The plurality of board viewer data pieces are provided in a one-to-one correspondence with the design data pieces of multilayer printed circuit boards previously designed using CAD. The user first requests the board viewer data capture processing section 102 to list the board viewer data through a graphical user interface (GUI) 101 provided by the OS 18. Then, the user selects the board viewer data corresponding to the multilayer printed circuit board to be checked out of the board viewer data list. The board viewer data capture processing section 102 acquires the board viewer data selected by the user from the board viewer data file storage section 103.

The layer configuration data capture processing section 104 acquires one of a plurality of pieces of layer configuration data previously stored as files in a layer configuration data file storage section 105 from the layer configuration data file storage section 105. The plurality of layer configuration data pieces are provided in a one-to-one correspondence with different types of provided layer configurations that can be used to design multilayer printed circuit boards. The user first requests the layer configuration data capture processing section 104 to list the layer configuration data through the graphical user interface (GUI) 101. Then, the user selects the layer configuration data actually used to design the multilayer printed circuit board to be checked out of the layer configuration data list. The layer configuration data capture processing section 104 acquires the layer configuration data selected by the user from the layer configuration data file storage section 105.

The merge processing section 106 merges the board viewer data acquired by the board viewer data capture processing section 102 and the layer configuration data acquired by the layer configuration data capture processing section 104 to generate board viewer data with layer configuration. The "board viewer data with layer configuration" output section 107 outputs the generated board viewer data with layer configuration to a "board viewer data with layer configuration" storage section 108 as an external file.

Figure 4:
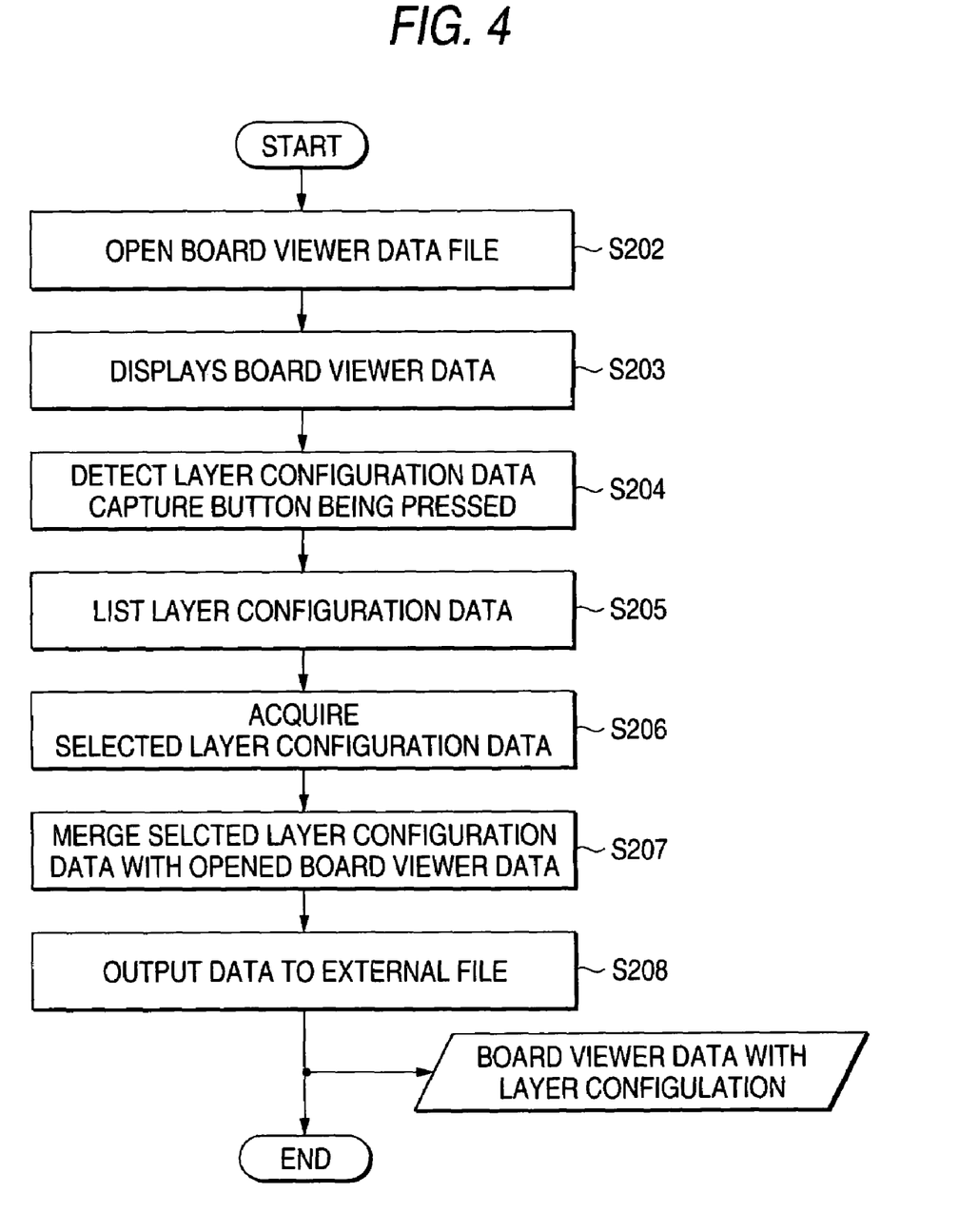
FIG. 4 is a flowchart to describe a generation processing procedure of board viewer data with layer configuration, executed by the board viewer program in FIG. 2.

Next, a procedure for generating the board viewer data with layer configuration will be discussed with reference to a flowchart of FIG. 4.

Generation processing of the board viewer data with layer configuration is performed on an operation screen provided by the board viewer program 19. The board viewer program 19 opens the board viewer data file selected by the user (step S202) and displays the board viewer data on the operation screen (step S203). A layer configuration data capture button for entering a layer configuration data acquisition command and the like are placed on the operation screen. When detecting that the user presses the layer configuration data capture button (step S204), the board viewer program 19 lists the layer configuration data on the operation screen (step S205). After this, the board viewer program 19 acquires the layer configuration data selected by the user out of the layer configuration data list from the layer configuration data capture processing section 104 (step S206).

The board viewer program 19 merges the layer configuration data with the opened board viewer data to generate board viewer data with layer configuration (step S207), and outputs the board viewer data with layer configuration to an external file (step S208).

Figure 5:
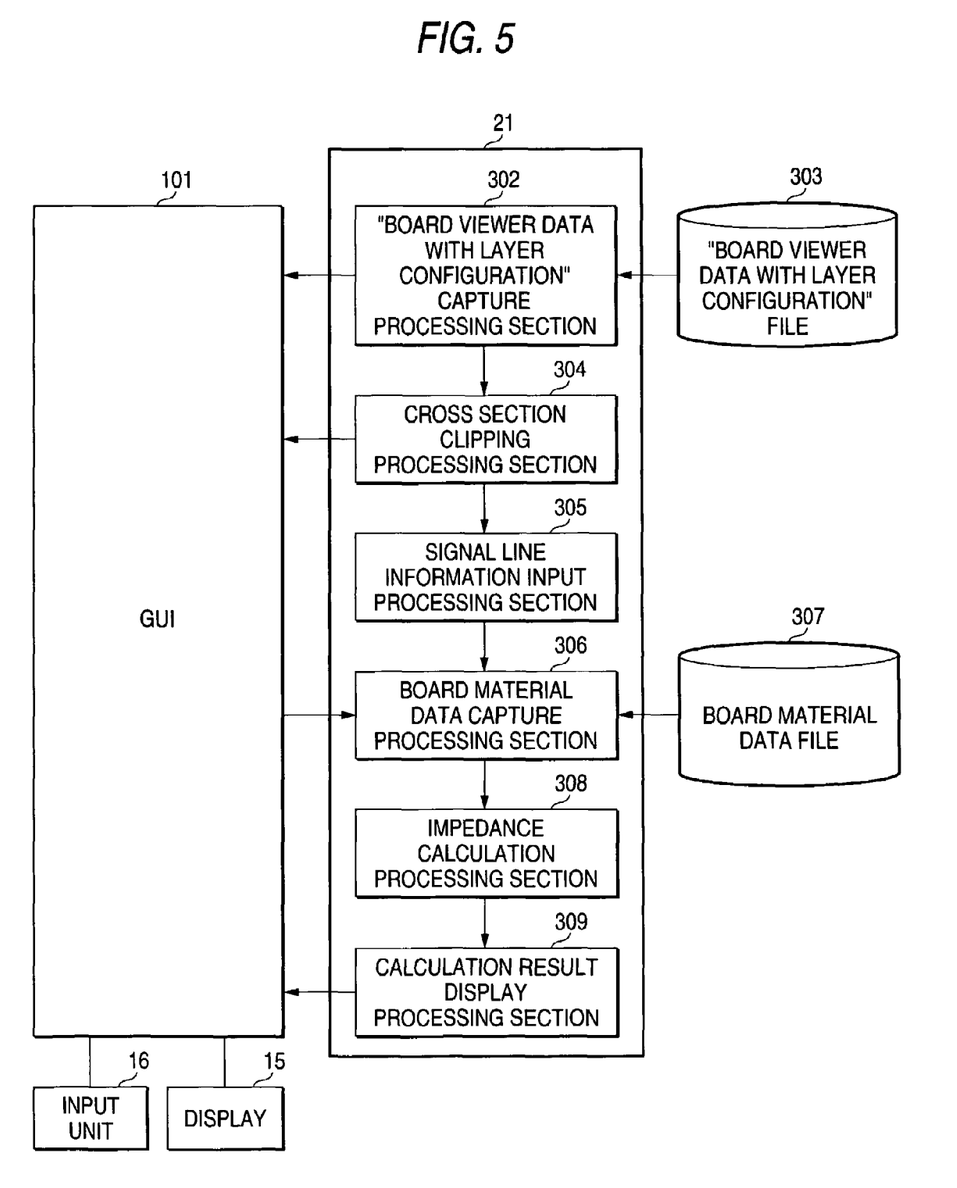
FIG. 5 is a block diagram to show the configuration of a board display processing section included in the board viewer program in FIG. 2.

Next, the functional configuration of the board display processing section 21 will be discussed with reference to FIG. 5.

As shown in the figure, the board display processing section 21 includes a "board viewer data with layer configuration" capture processing section 302, a cross section clipping processing section 304, a signal line information input processing section 305, a board material data capture processing section 306, an impedance calculation processing section 308, and a calculation result display processing section 309 as functional modules.

The "board viewer data with layer configuration" capture processing section 302 acquires the board viewer data with layer configuration corresponding to the multilayer printed circuit board to be checked, specified by the user from a "board viewer data with layer configuration" file storage section 303. The "board viewer data with layer configuration" capture processing section 302 executes processing of displaying the wiring layout drawing of the multilayer printed circuit board on the display 15 based on the acquired board viewer data with layer configuration. The wiring layout drawing display processing is executed based on the wiring layout information contained in the board viewer data with layer configuration.

The cross section clipping processing section 304 and the signal line information input processing section 305 are modules to make up the board cross section display processing section 22 described above.

The cross section clipping processing section 304 executes (1) processing of specifying the position on the wiring layout drawing in response to user's operation of the input unit 16, (2) processing of displaying the board cross section along the specified position on the display 15, and (3) processing of selecting the signal line whose impedance value is to be calculated on the board cross section in response to user's operation of the input unit 16.

The signal line information input processing section 305 executes (1) processing of displaying the signal line cross section indicating the line structure of the selected signal line on the display 15 and (2) processing of displaying the dimensions of the selected signal line and the dimensions of the insulating layers existing above and below the signal line on the signal line cross section.

The board material data capture processing section 306 acquires the characteristic values (relative dielectric constants) corresponding to the materials of the insulating layers existing above and below the selected signal line from a board material data file storage section 307. If the characteristic values (relative dielectric constants) of the insulating layers in the multilayer printed circuit board are preset in the layer configuration data, the board material data capture processing section 306 is not necessarily required.

The impedance calculation processing section 308 and the calculation result display processing section 309 are modules to make up the impedance calculation section 23 described above. The impedance calculation processing section 308 calculates the impedance value of the selected signal line. The parameters used to calculate the impedance value are, for example, the dimensions of the selected signal line (width, height, length), the dimensions of the insulating layers existing above and below the selected signal line (heights, etc.,), the relative dielectric constants of the insulating layers, and the like. The calculated impedance value is displayed on the display 15 by the calculation result display processing section 309.

Figure 6:
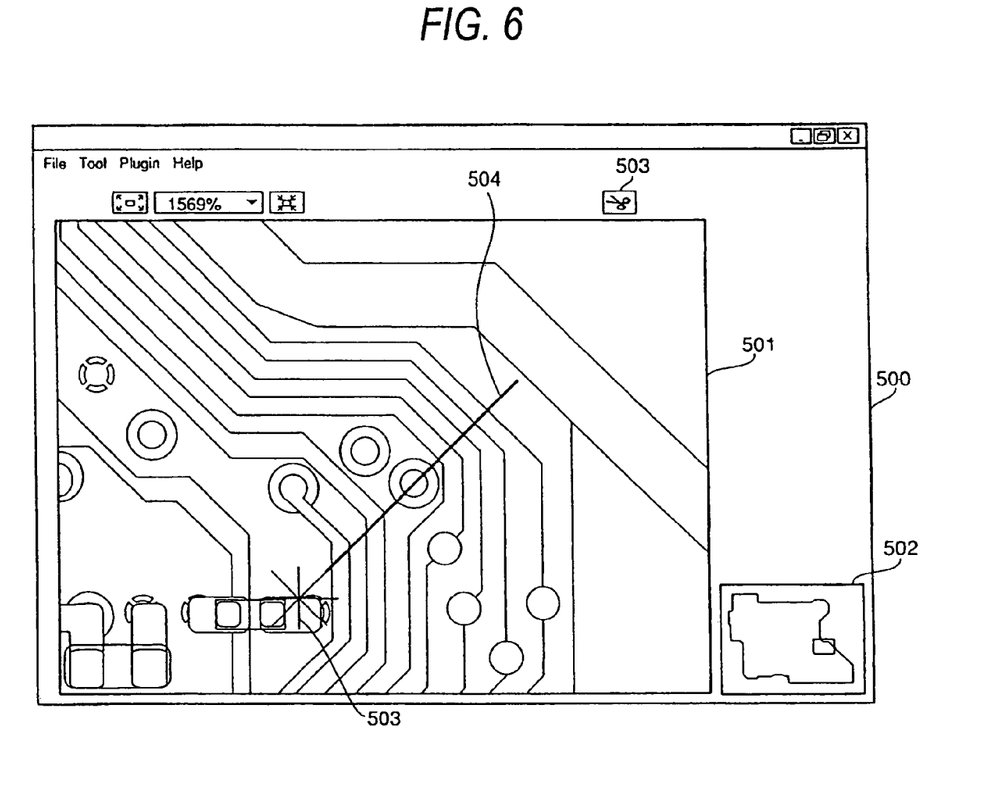
FIG. 6 is a drawing to show an example of a wiring layout drawing displayed by the board viewer program in FIG. 2.

FIG. 6 shows an example of the wiring layout drawing displayed by the board viewer program 19.

As shown in FIG. 6, a wiring layout drawing display area 501 and a layout scale-down display area 502 are placed on an operation screen 500 provided by the board viewer program 19. The wiring layout drawing display area 501 displays the wiring layout drawing of any desired portion of the multilayer printed circuit board. The layout scale-down display area 502 displays the whole shape of the multilayer printed circuit board and a rectangular frame indicating which portion of the multilayer printed circuit board is displayed in the wiring layout drawing display area 501 at present. The whole wiring layout drawing of the multilayer printed circuit board can also be displayed in the wiring layout drawing display area 501.

Since the wiring layout information contained in the board viewer data with layer configuration has the wiring layout information corresponding to each layer, the wiring layout drawing corresponding to any desired one of the layers making up the multilayer printed circuit board can be displayed in the wiring layout drawing display area 501. The layer whose wiring layout drawing is to be displayed can be switched in response to user's operation of the input unit 16.

A clipping mode button 503 is also placed on operation screen 500. If the user clicks on the clipping mode button 503, a pointer 503' to specify the position on the wiring layout drawing is displayed on the wiring layout drawing display area 501. The pointer 503' moves on the wiring layout drawing in response to user's operation of the input unit 16. The user can draw a clipping line 504 at any desired position on the wiring layout drawing by moving the pointer 503' while pressing a left button of a mouse, for example.

Figure 7:
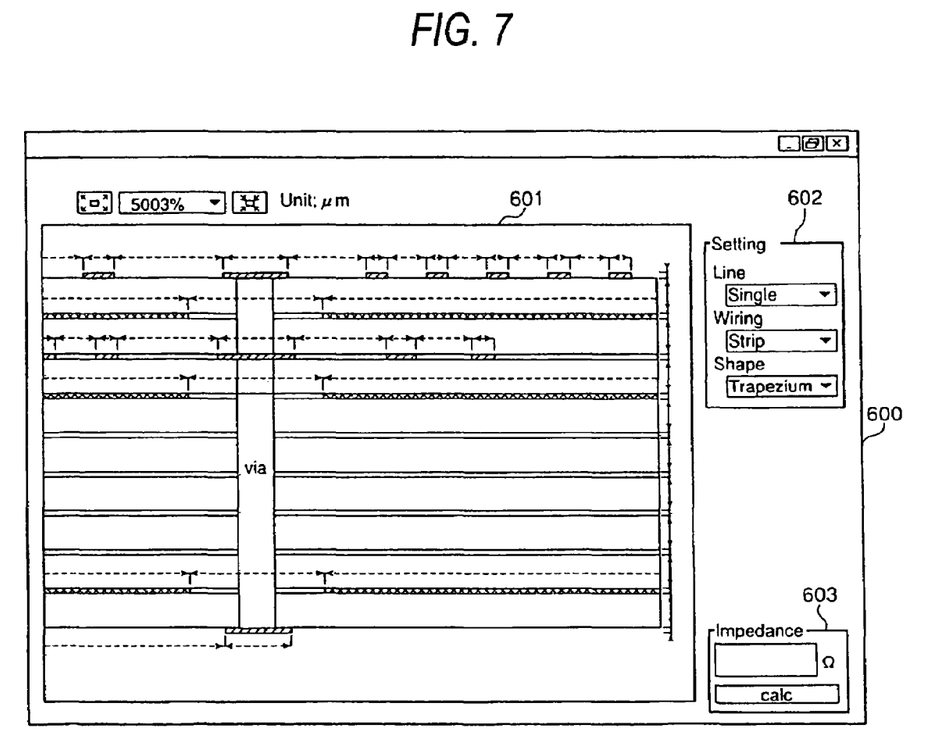
FIG. 7 is a drawing to show an example of a board cross section displayed by the board viewer program in FIG. 2.

FIG. 7 shows an example of the board cross section displayed by the board viewer program 19.

As shown in FIG. 7, a cross section display form 601, a setting form 602, and a calculation form 603 are placed on an operation screen 600 provided by the board viewer program 19. The cross section display form 601 is a display area to display the board cross section. The board cross section indicating the cross-sectional structure of the cutting plane specified with the clipping line 504 in FIG. 6 is displayed in the cross section display form 601.

Figure 8:
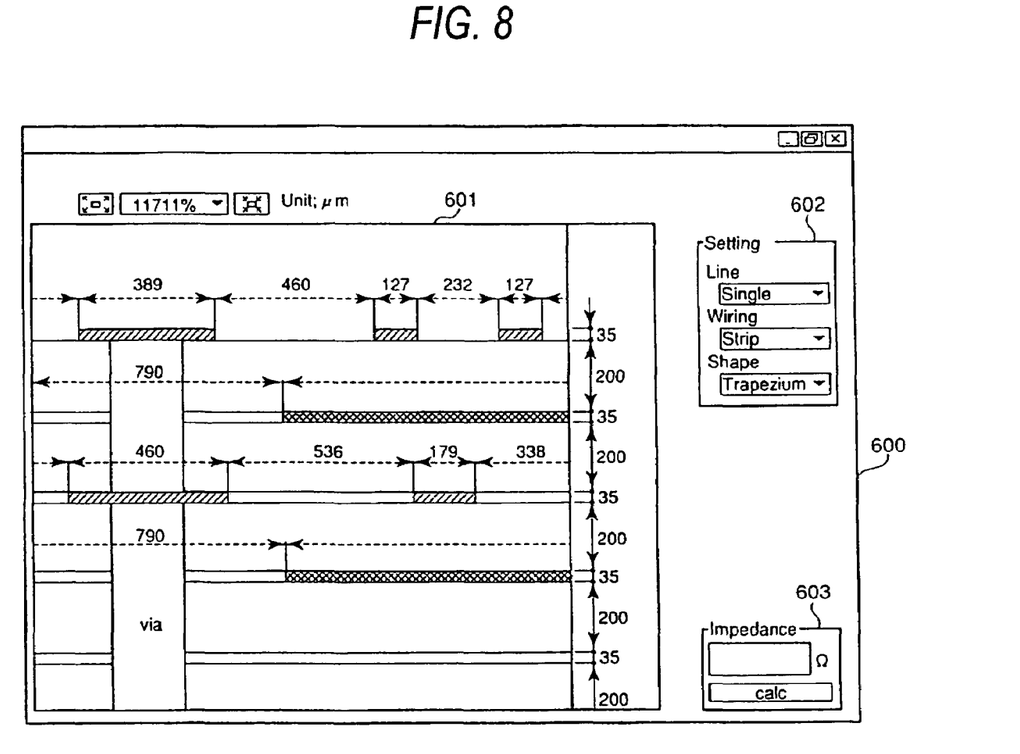
FIG. 8 is a drawing to show a display example of the board cross section in FIG. 7 on an enlarged scale.

In the cross section display form 601, the hatched portion indicates a signal line, and the cross-hatched portion indicates ground/power supply plane. Other layers than the signal lines or the ground/power supply planes are insulating layers. The value of the thickness of each signal line, the value of the height of each ground/power supply plane, and the value of the height of each insulating layer are given as the layer configuration data in the board viewer data with layer configuration. The value of the width of each signal line and the value of the width of each ground/power supply plane are given as the wiring layout information in the board viewer data with layer configuration. The board viewer program 19 draws the board cross section in the cross section display form 601 based on the board viewer data with layer configuration. The size of the display image of the board cross section can be scaled up and down as desired. FIG. 8 shows a state in which the display image of the board cross section is scaled up.

The setting form 602 is a setting form for setting attribute information concerning the signal line whose impedance is to be calculated in response to user's operation of the input unit 16. The board viewer program 19 can input the attribute information concerning the signal line whose impedance is to be calculated in response to operation of each of three pull-down menus "Line," "Wiring," and "Shape" in the setting form 602, executed by the user.

"Line" is a pull-down menu for entering line attribute information specifying the signal line whose impedance is to be calculated is which of single line (line) and differential line pair (differential). "Wiring" is a pull-down menu for entering line structure attribute information specifying the signal line whose impedance is to be calculated is a signal line having which line structure of microstrip line, strip line, and strip line buildup. The impedance is calculated using the impedance calculation expression corresponding to the line structure specified with the line structure attribute information.

The board cross section indicates the cross-sectional structures of the wiring layouts of all signal layers at the same time. Therefore, the user can easily understand the line structure of each signal line on the board cross section simply by seeing the board cross section.

"Shape" is a pull-down menu for entering shape attribute information specifying the signal line whose impedance is to be calculated is which of trapezoid (Trapezium) and inverted trapezoid (Inverted trapezium). The calculation form 603 displays the calculated impedance value.

The selection operation of the signal line whose impedance is to be calculated is executed on the board cross section. That is, the board viewer program 19 selects the signal line whose impedance is to be calculated from among the signal lines displayed on the board cross section in response to user's operation of the input unit 16. When the signal lines are selected, the name of the selected signal lines may be displayed as a hypertext embedded in the cross section display form 601.

Figure 9:
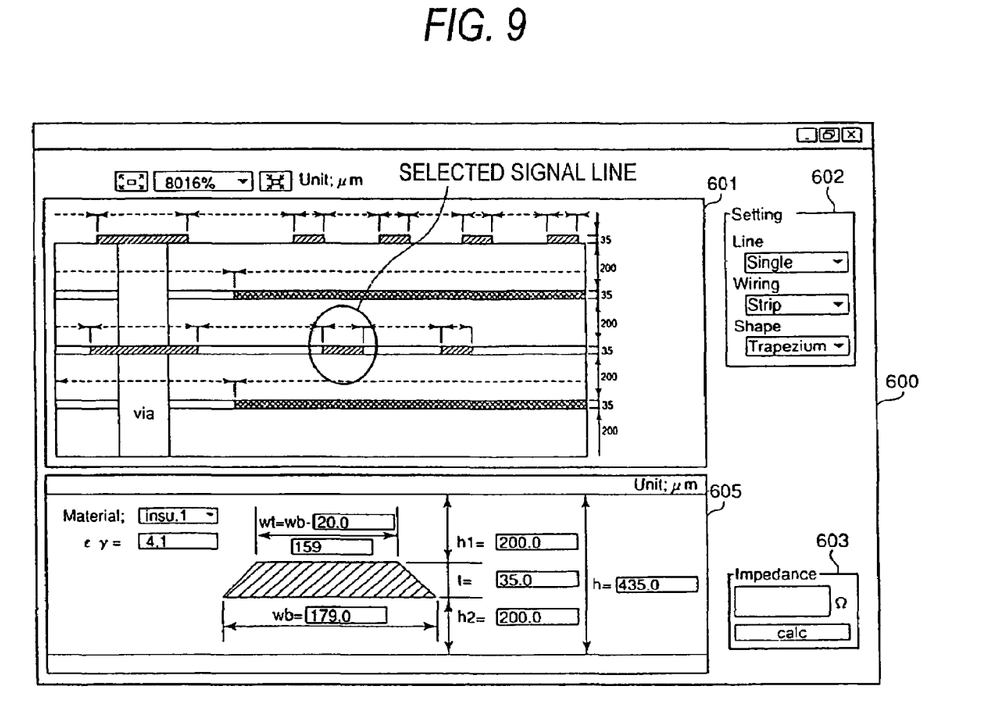
FIG. 9 is a drawing to show an example of a board cross section and a signal line cross section displayed by the board viewer program in FIG. 2.

The board viewer program 19 displays a calculation value input form 605 on the operation screen 600, as shown in FIG. 9. The calculation value input form 605 displays the signal line cross section indicating the line structure specified with the line structure attribute information (microstrip line, strip line, strip line buildup). The board viewer program 19 has prototypes of three types of signal line cross sections corresponding to microstrip line, strip line, and strip line buildup. The prototype corresponding to the line structure specified with the line structure attribute information is displayed in the calculation value input form 605. Input fields for inputting the dimension values used as the parameters for impedance calculation are displayed on the signal line cross section. In FIG. 9, t denotes the thickness of the signal line whose impedance is to be calculated, h1 denotes the height of the insulating layer above the signal line, and h2 denotes the height of the insulating layer below the signal line. wb and wt denote the widths of the base and the top side of the trapezoidal signal line. The board viewer program 19 automatically acquires the dimension values of t, h1, h2, wb, and wt from the board viewer data with layer configuration, and sets the dimension values in the corresponding input fields in the calculation form 603. The value of wt can be found by subtracting a predetermined constant from the value of wb acquired from the board viewer data with layer configuration.

A pull-down menu for entering material information specifying the materials of the insulating layers above and below the signal line whose impedance is to be calculated is placed in the calculation value input form 605. The user can use the pull-down menu to specify the material of the insulating layer. The board viewer program 19 automatically acquires the relative dielectric constant ($\epsilon r$) corresponding to the material of the insulating layer from the board material data file storage section 307, and sets the relative dielectric constant in a relative dielectric constant input field in the calculation value input form 605.

When the user clicks on a "Calc" button in the calculation form 603, the board viewer program 19 calculates the impedance value using the impedance calculation expression corresponding to the line structure specified with the line structure attribute information and the dimension values t, h1, h2, wb, and wt and the relative dielectric constant set in the input fields, and displays the calculated impedance value in the calculation form 603.

The dimension values and the relative dielectric constant set in the input fields can be corrected in response to user's operation of the input unit 16. When the user again clicks on the "Calc" button, the board viewer program 19 again calculates the impedance using the current dimension values set in the input fields. Using the re-calculation, the user can feed the dimension values and the relative dielectric constant to provide the appropriate impedance value back into the designer, etc., of the multilayer printed circuit board.

Figure 10:
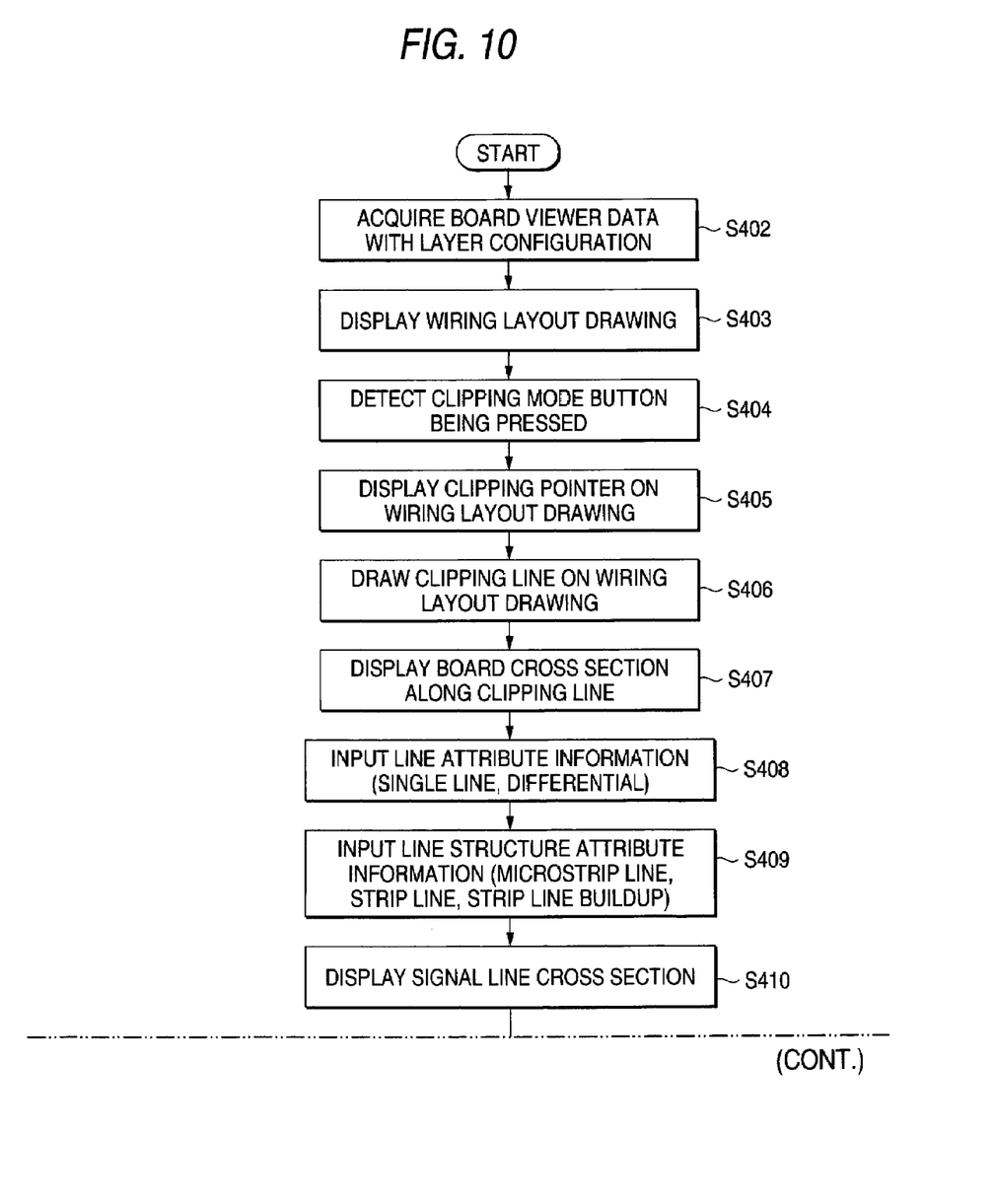
FIG. 10 is a flowchart to describe a procedure of impedance calculation processing executed by the board viewer program in FIG. 2.

Next, a processing sequence executed by the board viewer program 19 will be discussed with reference to a flowchart of FIG. 10.

The board viewer program 19 first acquires the board viewer data with layer configuration corresponding to the multilayer printed circuit board to be checked from the "board viewer data with layer configuration" file storage section 303 (step S402). Next, the board viewer program 19 displaysthe wiring layout drawing described with reference to FIG. 6 based on the wiring layout information contained in the board viewer data with layer configuration (step S403). When detecting the clipping mode button 503 being pressed (step S404), the board viewer program 19 displays the pointer 503' to specify the clipping position on the wiring layout drawing on the wiring layout drawing (step S405). Next, the board viewer program 19 draws the clipping line (straight line) 504 on the wiring layout drawing as the user moves the pointer 503' using the input unit 16 (step S406).

The board viewer program 19 displays the board cross section described with reference to FIG. 7 based on the board viewer data with layer configuration (step S407). Next, the board viewer program 19 inputs the line attribute information (single line, differential) and the line structure attribute information (microstrip line, strip line, strip line buildup) in response to user's operation of the input unit 16 (steps S408 and S409). The board viewer program 19 displays the signal line cross section indicating the line structure specified with the line structure attribute information (microstrip line, strip line, strip line buildup) (step S410).

Next, the board viewer program 19 selects the signal line whose impedance is to be calculated from among the signal lines displayed on the board cross section in FIG. 9 in response to user's operation of the input unit 16 (step S412). The board viewer program 19 determines whether or not the line structure of the selected signal line matches the shape of the displayed signal line cross section (step S413). This determination is executed only if the information concerning the line structure of each signal line is contained in the wiring layout information, for example. If a mismatch is found, namely, if the line structure of the selected signal line and the line structure specified by the user with the "Wiring" pull-down menu differ (NO at step S414), the board viewer program 19 displays an error message to the effect that the line structures differ (step S414). If the information concerning the line structure of each signal line is contained in the wiring layout information, steps S412 and S414 are skipped.

After this, the board viewer program 19 acquires the dimension values of the signal line and the dimension values of the insulating layers above and below the signal line from the board viewer data with layer configuration, and sets the dimension values in the corresponding input fields on the signal line cross section (step S415). When the user specifies the material of each insulating layer (step S416), the board viewer program 19 acquires the characteristic values such as the relative dielectric constant (∈r) corresponding to the specified material (board material) from the board material data file storage section 307, and sets the characteristic values in the corresponding input fields on the signal line cross section (step S417).

If the user clicks on the "Calc" button in a state in which all parameters required for calculating the impedance of the selected signal line are complete, the board viewer program 19 calculates the impedance of the selected signal line using the calculation expression corresponding to the line structure specified in the line structure attribute information and the parameters (steps S418 to S421). The calculated impedance value is displayed on the calculation form 603.

If the impedance value is not appropriate (NO at S422), the user can manually enter any desired parameter value through the input unit 16. The board viewer program 19 corrects the corresponding parameter value based on the manually entered value (step S419). If the user clicks on the "Calc" button, the board viewer program 19 again calculates the impedance of the selected signal line using the calculation expression corresponding to the line structure specified in the line structure attribute information and the parameters (step S421).

As described above, according to the invention, the board viewer program 19 can display the cross-sectional structure drawing at any desired position of the multilayer printed circuit board and moreover can present the impedance of any desired signal line displayed on the cross-sectional structure drawing to the user. Thus, it is made possible to make efficient evaluation/check work of the design data of the multilayer printed circuit board.

Similar advantages to those of the embodiment can be easily provided simply by introducing the board viewer program 19 into a usual computer through a computer-readable storage medium.

In this case, the program recorded in the computer-readable storage medium may be read and executed by a computer system. Incidentally, the "computer system" mentioned here includes an operation system or hardware such as peripheral equipment.

In addition, the "computer system" includes a homepage providing environment (or display environment) when it uses a WWW system.

On the other hand, the "computer-readable recording medium" means a portable medium such as a flexible disk, a magneto-optical disk, a ROM or a CD-ROM, or a storage unit such as a hard disk included in the computer system. Further the "computer-readable storage medium" includes a medium for holding the program for a predetermined time, such as a volatile memory (RAM) in a computer system as a server or a client when the program is transmitted through a network such as the Internet or a communication circuit such as a telephone circuit.

In addition, the program may be transmitted from a computer system storing the program in a storage unit or the like to another computer system through a transmission medium or by a transmitted wave in the transmission medium. Here, the "transmission medium" for transmitting the program means a medium having a function of transmitting information, including a network (communication circuit) such as the Internet or a communication circuit (communication line) such as a phone line.

In addition, the program may be prepared for attaining a part of the aforementioned functions. Further, the program may be a so-called difference file (difference program) which can attain the aforementioned functions in combination with a program which has been already recorded in the computer system.

Further, these modifications maybe used selectively and suitably in combination.

It is to be understood that the invention is not limited to the specific embodiment described above and that the invention can be embodied with the components modified without departing from the spirit and scope of the invention. The invention can be embodied in various forms according to appropriate combinations of the components disclosed in the embodiment described above. For example, some components may be deleted from all components shown in the embodiment. Further, the components in different embodiments may be used appropriately in combination.

What is claimed is:

1. An information processing apparatus comprising:
   an input unit;
   a storing unit configured to store wiring layout information, indicating a wiring layout of
   a multilayer printed circuit board, and layer configuration information, indicating a layer configuration of the multilayer printed circuit board;
   a data generation section configured to generate a wiring layout of a multilayer printed circuit board from the wiring layout information and the layer configuration information stored in said storing unit, said data generation section comprising:
   a board data capture processing section configured to process the wiring layout information;
   a layer data capture processing section configured to process the layer configuration information; and
   a merge unit configured to communicate with said board data processing section and said layer data capture processing section and merge the wiring layout information and layer configuration information to generate multilayer wiring layout data;
   a layout displaying unit configured to display a wiring layout drawing indicating the wiring layout of the multilayer printed circuit board on a display;
   a position specifying unit configured to specify a line on the displayed wiring layout drawing in response to a user's input received by the input unit; and
   a cross section displaying unit configured to display a cross section indicating a cross-sectional structure of the multi-layer wiring layout of the multilayer printed circuit board along the specified line on the display based on the wiring layout information and the layer configuration information.

2. The information processing apparatus as claimed in claim 1, further comprising:
a selecting unit configured to select a signal line whose impedance value is to be calculated on the cross section in response to user's operation of the input unit; and
an impedance calculation unit configured to calculate the impedance value of the selected signal line based on the wiring layout information and the layer configuration information and to display the calculated impedance value on the display.

3. The information processing apparatus as claimed in claim 2, further comprising:
a dimension display unit configured to display dimensions of the selected signal line and dimensions of insulting layers above and below the signal line on the display based on the wiring layout information and the layer configuration information; and
a dimension correcting unit configured to correct the displayed dimensions in response to user's operation of the input unit;
wherein the impedance calculation unit re-calculates the impedance value of the selected signal line based on the correction result and displays the re-calculated impedance value on the display.

4. The information processing apparatus as claimed in claim 3, further comprising:
a line structure information entering unit configured to enter line structure information specifying whether the signal line whose impedance value is to be calculated is a signal line having line structure of microstrip line or a signal line having line structure of strip line in response to user's operation of the input unit,
wherein the impedance calculation unit calculates the impedance value of the selected signal line based on the wiring layout information, the layer configuration information, and the line structure specified with the entered line structure information.

5. The information processing apparatus as claimed in claim 2 further comprising:
a line structure information entering unit configured to enter line structure information specifying whether the signal line whose impedance value is to be calculated is a signal line having line structure of microstrip line or a signal line having line structure of strip line in response to user's operation of the input unit;
a cross section display unit configured to display a signal line cross section indicating the line structure specified with the entered line structure information on the display;
a dimension display unit that displays dimensions of the selected signal line and dimensions of insulating layers above and below the signal line on the signal line cross section based on the wiring layout information and the layer configuration information; and
a correcting unit configured to correct the displayed dimensions in response to user's operation of the input unit,
wherein the impedance calculation unit re-calculates the impedance value of the selected signal line based on the correction result and displays the re-calculated impedance value on the display.

6. The information processing apparatus as claimed in claim 2, further comprising:

a material display unit configured to display materials of insulating layers above and below the signal line on the display based on the wiring layout information and the layer configuration information; and
a material correcting unit configured to correct the displayed materials in response to user's operation of the input unit;
wherein the impedance calculation unit re-calculates the impedance value of the selected signal line based on the correction result and displays the re-calculated impedance value on the display.

7. An information display method comprising:
processing wiring layout information stored in a storing unit with a board data capture processing section;
processing layer configuration information stored in a storing unit with a layer data capture processing section;
merging the wiring layout information and layer configuration information with a multi-layer wiring layout merge unit;
generating multi-layer wiring layout data indicating a wiring layout of a multilayer printed circuit board with the wiring layout information and the layer configuration information;
displaying the wiring layout drawing on a display;
specifying a line on the displayed wiring layout drawing in response to a user's input; and
displaying a cross section indicating a cross-sectional structure of the wiring layout of the multilayer printed circuit board along the specified line on the display based on layer configuration information indicating the layer configuration of the multilayer printed circuit board and the wiring layout information.

8. The information displaying method as claimed in claim 7, further comprising:
selecting a signal line whose impedance value is to be calculated on the cross section in response to user's operation of the input unit; and
calculating the impedance value of the selected signal line based on the wiring layout information and layer configuration information to display the calculated impedance value on the display.

9. The information displaying method as claimed in claim 8, further comprising:
displaying dimensions of the selected signal line and dimensions of insulating layers above and below the signal line on the display based on the wiring layout information and the layer configuration information; and
correcting the displayed dimensioned in response to user's operation of the input unit;
wherein the calculating of the impedance value include s re-calculating the impedance value of the selected signal line based on the correction result to display the re-calculated impedance value on the display.

10. The information display method as claimed in claim 7, further comprising:
entering line structure information specifying whether the signal line whose impedance value is to be calculated is a signal line having line structure of microstrip line or a signal line having line structure of strip line in response to user's operation of the input unit,
wherein the calculating of the impedance value includes calculating the impedance value of the selected signal line based on the wiring layout information, the layer configuration information, and the line structure specified with the entered line structure information.

11. The information display method as claimed in claim 8 further comprising:
- entering line structure information whether the signal line whose impedance value is to be calculated is a signal line having line structure of microstrip line or a signal line having line structure of strip line in response to user's operation;
- displaying a signal line cross section indicating the line structure specified with the entered line structure information on the display;
- displaying the dimensions of the selected signal line and the dimensions of insulating layers above and below the signal line on the signal line cross section based on the wiring layout information and the layer configuration information; and
- correcting the displayed dimensions in response to user's operation,
- wherein the step of calculating the impedance value includes: re-calculating the impedance value of the selected signal line based on the correction result to display the re-calculated impedance value on the display.

12. The information displaying method as claimed in claim 8 further comprising:
- displaying materials of insulating layers above and below the signal line one the display based on the wiring layout information and the layer configuration information; and
- correcting the displayed materials in response to user's operation;
- wherein the calculating of the impedance value includes re-calculating the impedance value of the selected signal line based on the correction result to display the re-calculated impedance value on the display.

13. A program product for enabling a computer to execute processing of displaying information, comprising:
- software instructions for enabling the computer to perform predetermined operations; and
- a computer readable medium bearing the software instructions,
- wherein the predetermined operations include:
- processing wiring layout information stored in a storing unit with a board data capture processing section;
- processing layer configuration information stored in a storing unit with a layer data capture processing section;
- merging the wiring layout information and layer configuration information with a multi-layer wiring layout merge unit;
- generating multi-layer wiring layout data indicating a wiring layout of a multilayer printed circuit board with the wiring layout information and the layer configuration information;
- displaying the wiring layout drawing on a display;
- specifying a line on the displayed wiring layout drawing in response to a user's input; and
- displaying a cross section indicating a cross-sectional structure of the wiring layout of the multilayer printed circuit board along the specified line on the display based on layer configuration information indicating a layer configuration of the multilayer printed circuit board and the wiring layout information.

14. The program product as claimed in claim 13, wherein the predetermined operations further comprises:
- selecting a signal line whose impedance value is to be calculated on the cross section in response to user's operation of the input unit, and
- calculating the impedance value of the selected signal line based on the wiring layout information and the layer configuration information to display the calculated impedance value on the display.

15. The program product as claimed in claim 14, wherein the predetermined operations further comprises:
- displaying dimensions of the selected signal line and dimensions of insulating layers above and below the signal line on the display based on the wiring layout information and the layer configuration information; and
- correcting the displayed dimensions in response to user's operation of the input unit, and
- wherein the calculating of the impedance value includes re-calculating the impedance value of the selected signal line based on the correction result to display the re-calculated impedance value on the display.

16. The program product as claimed in claim 14, wherein the predetermined operations further comprise:
- entering line structure information whether the signal line whose impedance value is to be calculated is a signal line having line structure of microstrip line or a signal ,line having line structure of strip line in response to user's operation of the input unit, and
- wherein the calculating of the impedance value includes calculating the impedance value of the selected signal line based on the wiring layout information, the layer configuration information, and the line structure specified with the entered line structure information.

17. The program product as claimed in claim 14, wherein the predetermined operations further comprises:
- entering line structure information specifying whether the signal line whose impedance value is to be calculated is a signal line having line structure of microstrip line or a signal line having line structure of strip line in response to user's operation of the input unit;
- displaying a signal line cross section indicating the line structure specified with the entered line structure information on the display;
- displaying the dimensions of the selected signal line and the dimensions of insulating layers above and below the signal line on the signal line cross section based on the wiring layout information and the layer configuration information; and
- correcting the displayed dimensions in response to user's operation, and
- wherein the calculating of the impedance value includes re-calculating the impedance value of the selected signal line based on the correction result to display the re-calculated impedance value on the display.

18. The program product as claimed in claim 14, wherein the predetermined operations further comprises:
- displaying materials of insulating layers above and below the signal line on the display based on the wiring layout information and the layer configuration information; and
- correcting the displaying materials in response to user's operation, wherein the calculating of the impedance value includes re-calculating the impedance value of the selected signal line based on the correction result to display the re-calculated impedance value on the display.

19. The information processing apparatus as claimed in claim 1, wherein the user's input comprises first and second points defining a line on the displayed wiring layout.

20. The information display method as claimed in claim 7, wherein the user's input comprises first and second points defining a line on the displayed wiring layout.

21. The program product as claimed in claim 13, wherein the user's input comprises first and second points defining a line on the displayed wiring layout.

* * * * *